(12) United States Patent
Yamamoto

(10) Patent No.: US 9,395,422 B2
(45) Date of Patent: Jul. 19, 2016

(54) MAGNETISM DETECTION DEVICE AND MAGNETISM DETECTION METHOD

(71) Applicant: ASAHI KASEI MICRODEVICES CORPORATION, Tokyo (JP)

(72) Inventor: Takeo Yamamoto, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 23 days.

(21) Appl. No.: 14/235,488

(22) PCT Filed: Apr. 8, 2013

(86) PCT No.: PCT/JP2013/002404
§ 371 (c)(1),
(2) Date: Jan. 28, 2014

(87) PCT Pub. No.: WO2013/168353
PCT Pub. Date: Nov. 14, 2013

(65) Prior Publication Data
US 2014/0210462 A1     Jul. 31, 2014

(30) Foreign Application Priority Data

May 11, 2012   (JP) ................................. 2012-109728

(51) Int. Cl.
*G01R 33/07*   (2006.01)
*H01L 43/06*   (2006.01)

(52) U.S. Cl.
CPC ........................................ *G01R 33/07* (2013.01)

(58) Field of Classification Search
CPC ....... G01R 33/07; G01R 33/02; G01R 33/072
USPC .................. 324/207, 251, 244, 76.77, 207.2; 338/32 H
See application file for complete search history.

(56) References Cited

U.S. PATENT DOCUMENTS

| | | | | |
|---|---|---|---|---|
| 6,046,944 A | * | 4/2000 | Singh | G11C 5/14 365/189.08 |
| 2008/0061775 A1 | | 3/2008 | Kikuiri | |

(Continued)

FOREIGN PATENT DOCUMENTS

| | | | | |
|---|---|---|---|---|
| JP | 2005-283503 A | | 10/2005 | |
| JP | 2005283503 A | * | 10/2005 | ............. G01R 33/07 |

(Continued)

OTHER PUBLICATIONS

Kato et al., Oct. 2005, Japan A.*

(Continued)

*Primary Examiner* — Patrick Assouad
*Assistant Examiner* — Taqi Nasir
(74) *Attorney, Agent, or Firm* — Morgan, Lewis & Bockius LLP

(57) ABSTRACT

The present invention relates to a magnetism detection device. First and second switch units switch a direction of a current flown from a bias generating unit across two opposite terminals of four terminals of a hall sensor, and switch a direction of a voltage to be available in remaining two opposite terminals in the direction orthogonal to the direction of the current, respectively, so that in a first period, a polarity of a hall electromotive force is a first polarity and a polarity of the hall offset voltage alternates four times, and in a second period, the polarity of the hall electromotive force is a second polarity opposite to the first polarity and the polarity of the hall offset voltage alternates four times.

8 Claims, 8 Drawing Sheets

(56) References Cited

U.S. PATENT DOCUMENTS

| | | |
|---|---|---|
| 2009/0315549 A1 | 12/2009 | Hackner et al. |
| 2010/0117640 A1 | 5/2010 | Sugiura |
| 2010/0164483 A1 | 7/2010 | Namai et al. |
| 2011/0187359 A1* | 8/2011 | Werth .................... B82Y 25/00 324/207.25 |

FOREIGN PATENT DOCUMENTS

| | | |
|---|---|---|
| JP | 2008-286695 A | 11/2008 |
| JP | 2009-544004 A | 12/2009 |
| JP | 2011-137716 A | 7/2011 |
| KR | 10-2009-0051117 A | 5/2009 |
| KR | 10-2010-0039269 A | 4/2010 |
| WO | 2007/116823 A1 | 10/2007 |

OTHER PUBLICATIONS

Bakker, et al., "Low-Offset Low-Noise 3.5mW CMOS Spinning-Current hall Effect Sensor with Integrated Chopper Amplifier", The 13th Annual European Conference on Solid-State Transducers, Sep. 12-15, 1999, The Hague, The Netherlands, pp. 1045-1048.

International Preliminary Report on Patentability dated Nov. 11, 2014, for the corresponding International Application No. PCT/JP2013/002404.

European Supplemental Search Report issued in European Patent Application No. 13787904.5 on Dec. 17, 2015.

* cited by examiner

| CYCLE | | T | | |
|---|---|---|---|---|
| TIME | 1/4T | 2/4T | 3/4T | 4/4T |
| PHASE | 0° | 90° | 180° | 270° |
| $V_{1H}$ | + | + | − | − |
| $V_{1O}$ | + | − | − | + |
| $V_{2O}$ | + | + | + | + |
| DEMODULATED SIGNAL IN THE THIRD SWITCH CIRCUIT | + | + | − | − |
| $V_{1H}'$ | + | + | + | + |
| $V_{1O}'$ | + | − | + | − |
| $V_{2O}'$ | + | + | − | − |

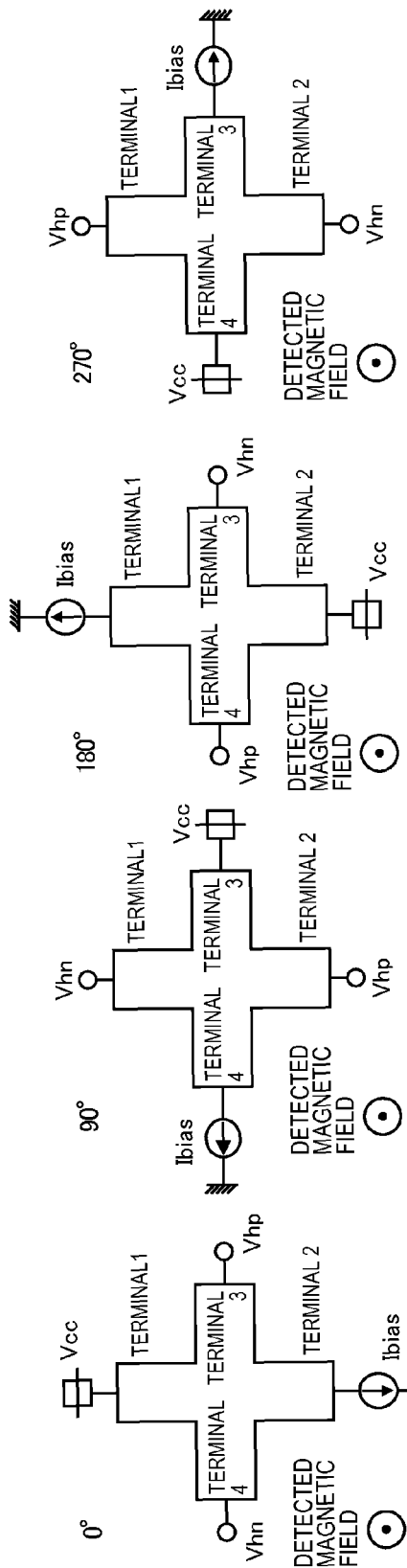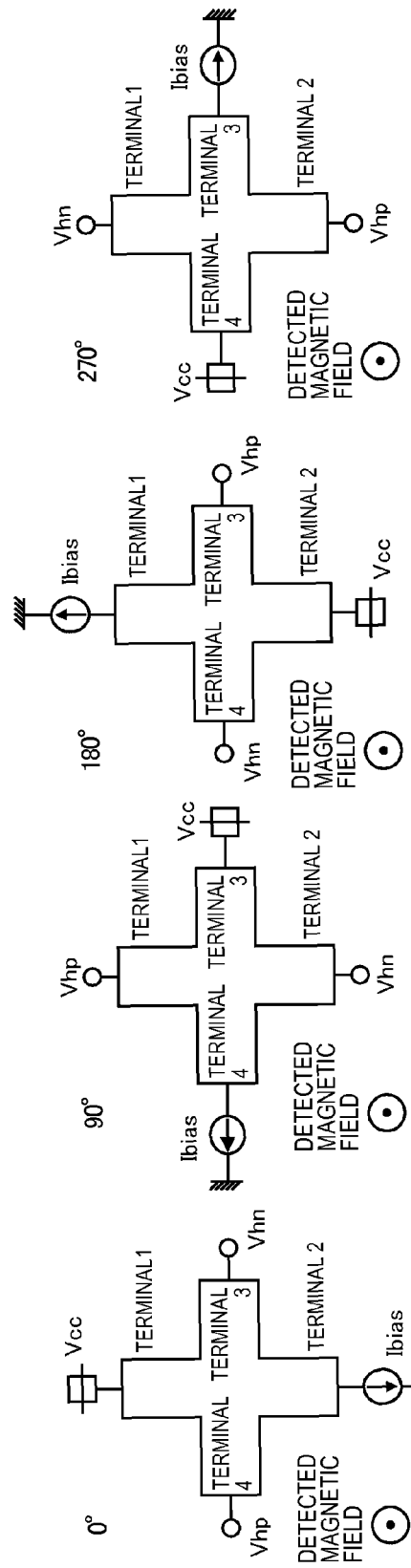

| CYCLE TIME | 1/8T | 2/8T | 3/8T | 4/8T | 5/8T | 6/8T | 7/8T | 8/8T |
|---|---|---|---|---|---|---|---|---|
| PHASE | 0° | 90° | 180° | 270° | 0° | 90° | 180° | 270° |
| $V_{1H}$ | + | + | + | + | − | − | − | − |
| $V_{1O}$ | + | − | + | − | − | + | − | + |
| $V_{2O}$ | + | + | + | + | + | + | + | + |
| DEMODULATED SIGNAL IN THE THIRD SWITCH CIRCUIT | + | + | + | + | − | − | − | − |
| $V_{1H}'$ | + | + | + | + | + | + | + | + |
| $V_{1O}'$ | + | − | + | − | + | − | + | − |
| $V_{2O}'$ | + | + | + | + | − | − | − | − |

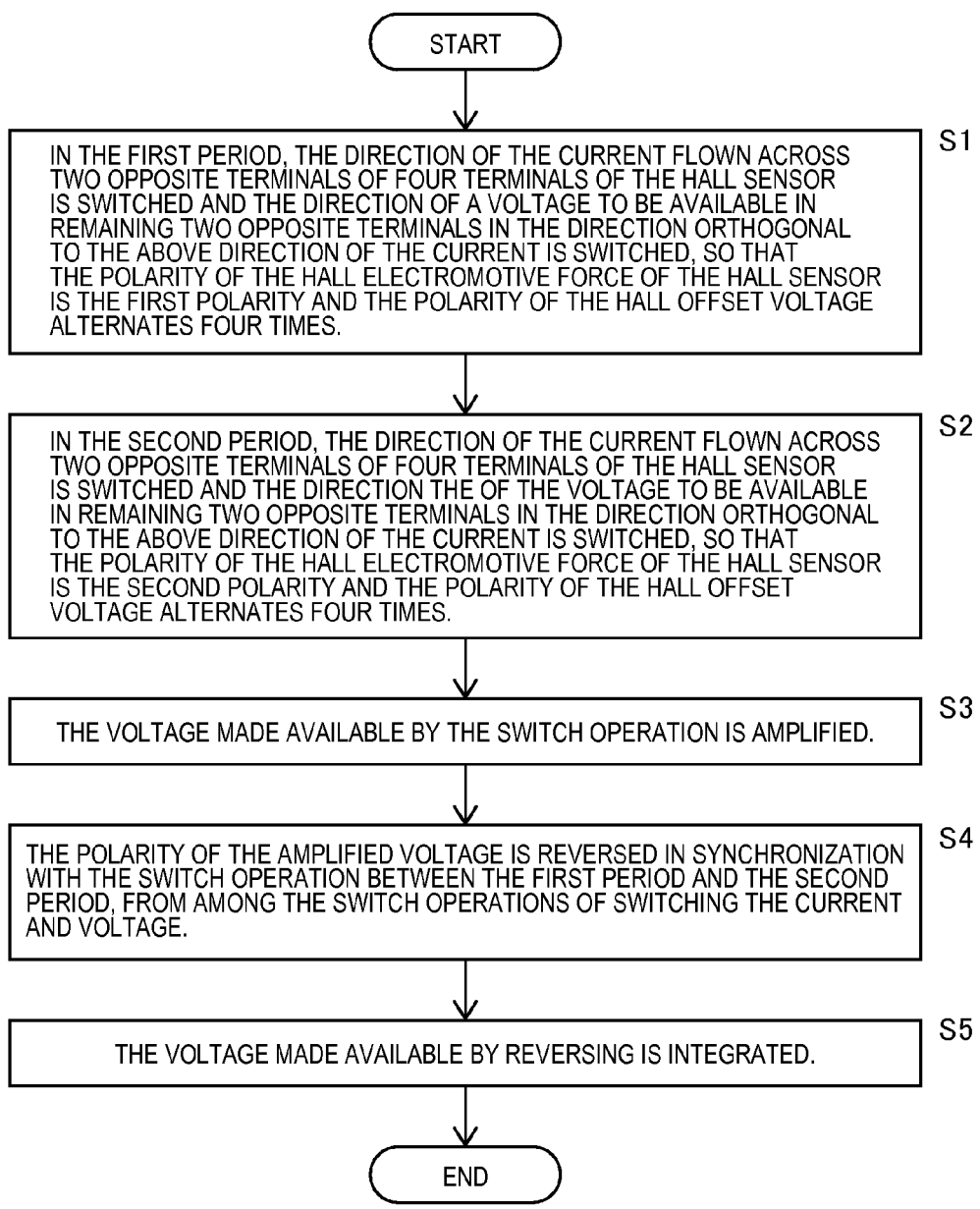

MAGNETISM DETECTION DEVICE AND MAGNETISM DETECTION METHOD

TECHNICAL FIELD

The present invention relates to magnetism detection devices and magnetism detection methods, and in particular, to a magnetism detection device and a magnetism detection method capable of suppressing an amplification degree of an integrator of an offset voltage of a hall sensor at the integrator by increasing a chopper modulation frequency of the offset voltage of the hall sensor, and capable of suppressing an operation voltage range considerably at the integrator.

BACKGROUND ART

In general, magnetic sensors having hall elements are for use in proximity sensors, linear position sensors, rotation angle sensors, and the like, as sensors that detect positional information of a magnet. In addition to them, magnetic sensors having hall elements are widely used as current sensors each that measure an amount of current flowing across a current conductor in a non-contact state, by detecting the magnetic field induced by the current flowing across the current conductor.

Further, since the hall elements have a magnetoelectric conversion function that generates a hall electromotive force signal depending on the magnitude of the magnetic field that has been input, they are widely used as magnetic sensors. The hall elements, however, have an offset voltage (unbalanced voltage) which means that a limited voltage, which is not zero, will be output, even if there is no magnetic field, which is even in a non-magnetic field state.

Hence, as to a magnetic sensor having the hall element, there are hall element driving methods generally known as Spinning current method or Connection communication method, for the purpose of cancelling the offset voltage of the hall element. In such a method, the positions of a terminal pair for causing the drive current to flow across the hall element and the positions of another terminal pair for detecting the hall electromotive force signal are switched periodically according to a clock called chopper clock.

The above Spinning current method for the purpose of cancelling the offset voltage can be configured with a switch circuit also in a CMOS semiconductor circuit. Thus, a hall electromotive force detection circuit for achieving a magnetic sensor with high accuracy is generally provided with the switch circuit for achieving the Spinning current method.

In a magnetism detection device that utilizes a hall sensor, since the hall element has the offset voltage, the offset voltage is removed. As an example, Spinning current principle described in Non-Patent Document 1 is known.

In such a magnetism detection device, however, when the polarities of the input voltages to a differential amplifier become different by switch operation of the switch, the settling time of the differential amplifier is finite, and in addition, the settling time at the rising of the input voltage and the settling time at the falling thereof are different. This will bring an influence on voltage waveforms of the output voltage of the differential amplifier and the output voltage of the switch. Since the voltage waveforms of the output voltage of the switch are different as described above, even if an integrator integrates the output voltage, there is a problem in that neither the offset voltage of the hall element nor the offset voltage specific to the differential amplifier can be removed.

Accordingly, in order to address the drawback of this type, for example, Patent Document 1 describes a magnetism detection device capable of removing the offset voltage of the hall element and the offset voltage specific to the amplifier that amplifies the output of the hall element. What is described in Patent Document 1 is that the switch controller controls the switch to switch the directions of currents at opposite two terminals of the four terminals, so that the polarity of the hall offset voltage specific to the hall element having four terminals alternates four times per cycle. The differential amplifier amplifies the voltage of the opposite two terminals in a direction orthogonal to the direction of the current. In the switch operation of the switch for switching the direction of the current, if the switch operation makes the direction of the current opposite to the previous one, the switch controller controls the switch in synchronization therewith to reverse the polarity of the voltage from the differential amplifier. In addition, in synchronization with the immediately following switch operation of switching the direction of the current, the switch controller controls the switch to reverse the polarity of the voltage from the differential amplifier.

Further, for example, Patent Document 2 is related to a magnetism detection device enabling to have high-speed responsiveness, while excluding disturbance noises received by the hall element or the amplifier that amplifies the signal from the hall element.

Moreover, for example, Patent Document 3 is related to a magnetism detection device capable of removing the offset voltage of the magnetism detection sensor and the offset voltage of the analog element in the analog circuit, and detecting the magnetism of the magnetism detection sensor with high accuracy.

FIG. 1 is a circuit configuration view illustrative of a conventional magnetism detection device. In FIG. 1, reference numeral 1 indicates a hall sensor, reference numeral 2 indicates a bias current generating circuit, reference numeral 3 indicates a first switch circuit, reference numeral 4 indicates a second switch circuit, reference numeral 5 indicates a differential amplifier, reference numeral 6 indicates a third switch circuit, reference numeral 7 indicates an integrator, and reference numeral 8 indicates a switch control circuit.

The conventional magnetism detection device illustrated in FIG. 1 is provided with: the hall sensor 1 that detects magnetism; the bias current generating circuit 2 that drives the hall sensor 1; the first switch circuit 3 that switches the direction of the bias current applied to the hall sensor 1; the second switch circuit 4 that switches the direction of the differential voltage corresponding to the magnetism detected by the hall sensor 1; the differential amplifier 5 that amplifies an output differential voltage $V_1$ of the second switch circuit 4; the third switch circuit 6 that switches the polarity of the output differential voltage of the differential amplifier 5; the integrator 7 that integrates and amplifies an output differential voltage $V_2$ of the third switch circuit 6; and the switch control circuit 8 that controls a switch timing of the first to third switch circuits.

By controlling the first switch circuit 3 and the second switch circuit 4, the bias current is supplied between opposite two terminals of four terminals of the hall sensor 1, whereas the remaining opposite two terminals of the four terminals are connected to the differential amplifier 5.

FIG. 2A to FIG. 2D are views illustrative of connection states of the hall sensor in respective chopper phases switched by the switch circuits illustrated in FIG. 1. As illustrated in FIG. 2A to FIG. 2D, four phases of 0°→90°→180°→270° are periodically changed in this order and connected. Expressions (1) to (4) represent a hall electromotive force $V_{1H}$ corresponding to the bias current and the direction and magnitude of the detected magnetic field, and the output differential voltage $V_1$ of the hall sensor 1 in which an offset voltage $V_{1O}$ specific to the hall sensor 1 is added.

Herein, the output differential voltage $V_1$ of the hall sensor 1 is defined by Vhp-Vhn.

$$0°: V_1\left(t = n \times \frac{T}{4}\right) = +V_{1H} + V_{1O} \quad (1)$$

$$90°: V_1\left(t = n \times \frac{2T}{4}\right) = +V_{1H} - V_{1O} \quad (2)$$

$$180°: V_1\left(t = n \times \frac{3T}{4}\right) = -V_{1H} - V_{1O} \quad (3)$$

$$270°: V_1\left(t = n \times \frac{4T}{4}\right) = -V_{1H} + V_{1O} \quad (4)$$

The differential amplifier 5 amplifies the output differential voltage $V_1$ of the second switch circuit 4 and the offset voltage $V_{2O}$ specific to the differential amplifier 5 at a fixed magnification A. By controlling the third switch circuit 6, the polarity of the output differential voltage of the differential amplifier 5 is periodically switched and supplied to the integrator 7. The output differential voltage $V_2$ of the third switch circuit 6 is represented by expressions (5) to (8).

$$0°: V_2\left(t = n \times \frac{T}{4}\right) = A \times (+V_{1H} + V_{1O} + V_{2O}) \quad (5)$$

$$90°: V_2\left(t = n \times \frac{2T}{4}\right) = A \times (+V_{1H} - V_{1O} + V_{2O}) \quad (6)$$

$$180°: V_2\left(t = n \times \frac{3T}{4}\right) = -A \times (-V_{1H} - V_{1O} + V_{2O}) \quad (7)$$

$$270°: V_2\left(t = n \times \frac{4T}{4}\right) = -A \times (-V_{1H} + V_{1O} + V_{2O}) \quad (8)$$

FIG. 3 is a view illustrative of the polarities of the output voltages in the respective chopper phases switched by the switch circuits illustrated in FIG. 1. FIG. 3 indicates polarities of the hall electromotive force $V_{1H}$, the offset voltage $V_{1O}$ of the hall sensor 1, and the offset voltage $V_{2O}$ of the differential amplifier 5, and in addition, indicates polarities of the hall electromotive force $V_{1H}'$, the offset voltage $V_{1O}'$ of the hall sensor 1, and the offset voltage $V_{2O}'$ of the differential amplifier 5, which are demodulated by the first switch circuit 3. While the chopper operations are being repeated "n" times from 0° to 270°, the integrator 7 integrates and amplifies the output differential voltage $V_2$ of the third switch circuit 6.

FIG. 4 is a view illustrative of output waveforms of the integrator of FIG. 1. An output $V_3$ of the integrator 7 is represented by Expression (9) and has a voltage waveform as illustrated in FIG. 4.

$$V_3 = \sum_{t=0}^{t=nT} V_2(t) = \quad (9)$$

$$n \times \left( \sum_{t=0}^{t=\frac{T}{4}} V_2(t) + \sum_{t=\frac{T}{4}}^{t=\frac{2T}{4}} V_2(t) + \sum_{t=\frac{2T}{4}}^{t=\frac{3T}{4}} V_2(t) + \sum_{t=\frac{3T}{4}}^{t=\frac{4T}{4}} V_2(t) \right) = n \times 4AV_{1H}$$

Herein, $V_{1H\_INT}$ is an integrated and amplified waveform of $V_{1H}$ component in the output $V_3$ of the integrator 7. $V_{1O\_INT}$ is an integrated and amplified waveform of $V_{1O}$ component in the output $V_3$ of the integrator 7. $V_{2O\_INT}$ is an integrated and amplified waveform of $V_{2O}$ component in the output $V_3$ of the integrator 7. The chopper modulation is done by the first switch circuit 3 to the third switch circuit 6, and therefore, the offset voltage $V_{1O}$ of the hall sensor 1 and the offset voltage $V_{2O}$ of the differential amplifier 5 are cancelled in each of the chopper operations of 0° to 270°. Only the hall electromotive force $V_{1H}$ can be integrated and amplified.

FIG. 5 is a view illustrative of frequency characteristics of a chopper modulation transfer function with respect to the hall sensor noise. The chopper modulation is done by the first switch circuit 3 to the third switch circuit 6, and therefore, the element noises of the hall sensor 1 and the differential amplifier 5 can be modulated to higher frequencies near the frequency band of an odd multiple of the chopper modulation frequency $F_{CHP}$ (=1/T). The noises can be suppressed by the characteristics of the integrator 7 at the later stage.

PRIOR ART DOCUMENTS

Patent Documents

Patent Document 1: JP 2005-283503 A
Patent Document 2: JP 2008-286695 A
Patent Document 3: JP 2011-137716 A Non-Patent Documents Non-Patent Document 1: A. Bakker, A. A. Bellekom, S. Middelhoekand, J. H. Huijsing "Low-Offset Low-Noise 3.5 mW CMOS Spinning-Current Hall Effect Sensor With Integrated Chopper Amplifier" The 13th European Conference on Solid-State Transducers Sep. 12-15, 1999, The Hague, The Netherlands, pp. 1045-1048

SUMMARY OF THE INVENTION

Problem to be Solved

It is to be noted that, however, the amplification degree of the integrator 7 is set such that the output voltage $V_3$ of the integrator 7 does not to exceed the operable voltage range while the integrator 7 is doing the chopper operation of 0° to 270°. In this situation, if the offset voltage $V_{1O}$ of the hall sensor 1 is sufficiently higher than the hall electromotive force $V_{1H}$, the amplification degree of the integrator 7 is limited by the offset voltage $V_{1O}$ of the hall sensor 1 and the hall electromotive force $V_{1H}$ cannot be amplified sufficiently. Thus, the chopper modulation frequency is set to $2F_{CHP}$ (=2/T) so that the chopper operation is done "2n" times. Hence, since the amplification degree of the integrator 7 for the offset voltage $V_{1O}$ of the hall sensor 1 in each chopper phase is halved, the operation voltage range at the integrator 7 can be considerably suppressed with the amplification degree and the integration time of the integrator 7 being maintained.

However, when the output frequency band of the differential amplifier 5 is limited to a low frequency for the purpose of suppressing the noises of the hall sensor 1 and the differential amplifier 5 or preventing the folding noise of the sampling frequency occurring in a case where a sample-hold circuit such as a switched capacitor filter or the like is used in the integrator 7, $2F_{CHP}$ set to the chopper modulation frequency also doubles the chopper modulation frequency of the hall electromotive force $V_{1H}$. This causes a settling error because the frequency band is insufficient at the differential amplifier 5. This increases the signal loss of the hall electromotive force $V_{1H}$ at the time of demodulation at the third switch circuit 6 and the amplification degree for the hall electromotive force $V_{1H}$ in the whole system degrades, thereby leading to a problem that S/N degrades. Besides, if the output frequency band of the differential amplifier 5 highly depends on the temperature, the temperature variation in the output voltage $V_3$ of the integrator 7 is also increased as a result.

The present invention has been made in view of the above-described problem, and has an object to provide a magnetism detection device and a magnetism detection method capable of suppressing the amplification degree of the integrator of the offset voltage of the hall sensor at the integrator and suppressing the operation voltage range at the integrator considerably, by increasing the chopper modulation frequency of the offset voltage of the hall sensor.

Solution to the Problem

The present invention has been made to achieve the above object, and according to an aspect of the present invention, there is provided a magnetism detection device comprising: a hall sensor that detects magnetism; a bias generating unit that drives the hall sensor; a switch unit that is connected to the hall sensor, that carries out a switch operation of switching a direction of current flown from the bias generating unit across two opposite terminals of four terminals of the hall sensor, and switching the direction of a voltage to be available in remaining two opposite terminals in a direction orthogonal to the direction of the current, so that in a first period, a polarity of a hall electromotive force of the hall sensor is a first polarity and a polarity of the hall offset voltage of the hall sensor alternates four times, and in a second period, the polarity of the hall electromotive force of the hall sensor is a second polarity opposite to the first polarity and the polarity of the hall offset voltage of the hall sensor alternates four times; an amplifier that amplifies the voltage made available by the switch operation of the switch unit; and a reversing unit that reverses the polarity of the voltage from the amplifier in synchronization with the switching operation between the first period and the second period out of switching operations of the current and the voltage switched by the switch unit.

Additionally, in the above-described magnetism detection device, the switch unit may carry out, in the first period: a first switch operation of connecting the bias generating unit with a first terminal of the hall sensor and a second terminal of the hall sensor opposite to the first terminal so that the current is to be flown from the first terminal toward the second terminal, and also connecting a third terminal of the hall sensor and a fourth terminal of the hall sensor opposite to the third terminal with a positive input terminal and a negative input terminal of the amplifier, respectively; a second switch operation of connecting the bias generating unit with the third terminal and the fourth terminal so that the current is to be flown from the third terminal toward the fourth terminal, and also connecting the second terminal and the first terminal with the positive input terminal and the negative input terminal of the amplifier, respectively; a third switch operation of connecting the bias generating unit with the second terminal and the first terminal so that the current is to be flown from the second terminal toward the first terminal, and also connecting the fourth terminal and the third terminal with the positive input terminal and the negative input terminal of the amplifier, respectively; and a fourth switch operation of connecting the bias generating unit with the fourth terminal and the third terminal so that the current is to be flown from the fourth terminal toward the third terminal, and also connecting the first terminal and the second terminal with the positive input terminal and the negative input terminal of the amplifier, respectively, and the switch unit may carry out, in the second period: a fifth switch operation of connecting the bias generating unit with the first terminal and the second terminal so that the current is to be flown from the first terminal toward the second terminal, and also connecting the fourth terminal and the third terminal with the positive input terminal and the negative input terminal of the amplifier, respectively; a sixth switch operation of connecting the bias generating unit with the third terminal and the fourth terminal so that the current is to be flown from the third terminal toward the fourth terminal, and also connecting the first terminal and the second terminal with the positive input terminal and the negative input terminal of the amplifier, respectively; a seventh switch operation of connecting the bias generating unit with the second terminal and the first terminal so that the current is to be flown from the second terminal toward the first terminal, and also connecting the third terminal and the fourth terminal with the positive input terminal and the negative input terminal of the amplifier, respectively; and an eighth switch operation of connecting the bias generating unit with the fourth terminal and the third terminal so that the current is to be flown from the fourth terminal toward the third terminal, and that also connecting the second terminal and the first terminal with the positive input terminal and the negative input terminal of the amplifier, respectively.

Further, in the above-described magnetism detection device, the switch unit may repeat the switch operation in the first period n times, where n is an integer equal to or greater than 2, and repeats the switch operation in the second period n times, and the reversing unit may reverse the polarity of the voltage from the amplifier in synchronization with the switching operation between the first period and the second period.

According to another aspect of the present invention, there is provided a magnetism detection device comprising: a hall sensor that detects magnetism; a bias generating unit that drives the hall sensor; a switch unit that carries out a switch operation of switching a direction of a current flown from the bias generating unit across two opposite terminals of four terminals of the hall sensor, and that carries out a switch operation of switching a direction of a voltage to be available in remaining two opposite terminals in a direction orthogonal to the direction of the current, respectively; an amplifier that amplifies the voltage made available by the switch operation of the switch unit; and a reversing unit that reverses a polarity of voltage from the amplifier, wherein an operation frequency when a polarity of a hall offset voltage of the hall sensor alternates is 2n times the operation frequency when a polarity of a hall electromotive force of the hall sensor alternates, where n is an integer equal to or greater than 1.

According to yet another aspect of the present invention, there is provided a magnetism detection method in a magnetism detection device comprising a hall sensor that detects magnetism and a bias generating unit that drives the hall sensor, the magnetism detection method comprising: carrying out, by a switch unit connected to the hall sensor, a switch operation of switching a direction of a current flown across two opposite terminals of four terminals of the hall sensor, and switching a direction of a voltage to be available in remaining two opposite terminals in a direction orthogonal to the direction of the current, respectively, so that in a first period, a polarity of a hall electromotive force of the hall sensor is a first polarity and a polarity of a hall offset voltage of the hall sensor alternates four times; carrying out, by the switch unit connected to the hall sensor, a switch operation of switching the direction of the current flown across the two opposite terminals of the four terminals of the hall sensor, and switching the direction of the voltage to be available in the remaining two opposite terminals in the direction orthogonal to the direction of the current, so that in a second period, the polarity of the hall electromotive force of the hall sensor is a second polarity opposite to the first polarity and the polarity of the hall offset voltage alternates four times; amplifying, by an amplifier, the voltage made available by the switch operation of the switch unit; and reversing, by a reversing unit, a polarity of the amplified voltage in synchronization with the switch operation between the first period and the second period out of the switch operations of switching the current and the voltage by the switch unit.

Advantageous Effects of the Invention

According to the present invention, it is possible to provide a magnetism detection device and a magnetism detection method capable of suppressing the amplification degree of the integrator of the offset voltage of the hall sensor at the integrator and suppressing the operation voltage range at the integrator considerably, by increasing the chopper modulation frequency of the offset voltage of the hall sensor.

BRIEF DESCRIPTION OF THE DRAWINGS

FIG. 7A to FIG. 7H are views illustrative of connection states of the hall sensor in the respective chopper phases switched by the switch units in the magnetism detection device illustrated in FIG. 6, according to the present invention;

FIG. 11 is a flowchart illustrative of a magnetism detection method according to the present invention.

DESCRIPTION OF EMBODIMENTS

Hereinafter, embodiments of the present invention will be described with reference to the drawings.

Figure 6:
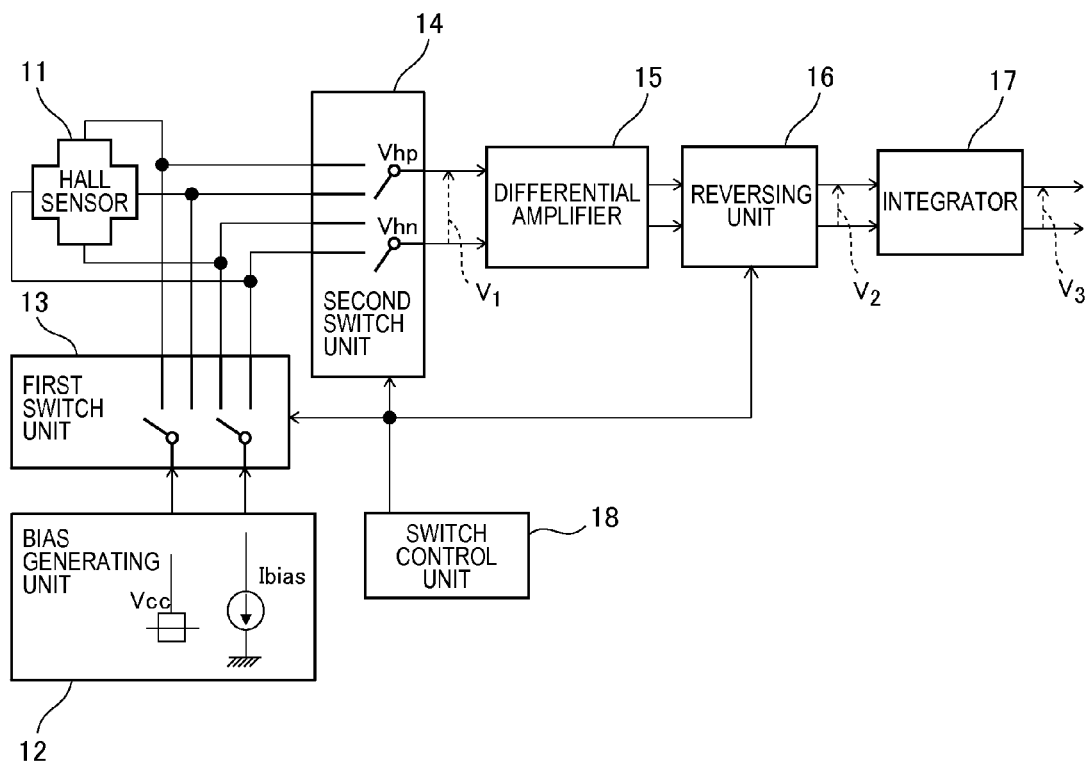
FIG. 6 is a circuit configuration view illustrative of an embodiment of the magnetism detection device according to the present embodiment.

FIG. 6 is a circuit configuration view illustrative of a magnetism detection device according to the present embodiment. In the drawings, reference numeral 11 is a hall sensor, reference numeral 12 is a bias generating unit, reference numeral 13 is a first switch unit, reference numeral 14 is a second switch unit, reference numeral 15 is a differential amplifier, reference numeral 16 is a reversing unit (third switch unit), reference numeral 17 is an integrator, and reference numeral 18 is a switch control unit.

The magnetism detection device illustrated in FIG. 6 according to the present embodiment is provided with the hall sensor 11 that detects magnetism; and the bias generating unit 12 that drives the hall sensor 11. In addition, the first switch unit 13 and the second switch unit 14 switch the direction of a current flown from the bias generating unit 12 across two opposite terminals of four terminals of the hall sensor 11, and switch the direction of a voltage to be available in remaining two opposite terminals in the direction orthogonal to the above direction of the current, so that in the first period, the polarity of the hall electromotive force of the hall sensor 11 is a first polarity and the polarity of the hall offset voltage alternates four times, and in the second period, the polarity of the hall electromotive force of the hall sensor 11 is a second polarity opposite to the first polarity and the polarity of the hall offset voltage alternates four times.

Further, the differential amplifier 15 amplifies the voltage made available by the switch operations of the first switch unit 13 and the second switch unit 14. Moreover, the reversing unit 16 reverses the polarity of the voltage from the differential amplifier 15 in synchronization with the switch operation between the first period and the second period out of the switch operations of the first switch unit 13 and the second switch unit 14 switching the current and voltage. Furthermore, the integrator 17 integrates the voltage made available by the reversing unit 16 reversing the polarity.

FIG. 7A to FIG. 7H are views illustrative of connection states of the hall sensor in the respective chopper phases switched by the switch units in the magnetism detection device illustrated in FIG. 6, according to the present embodiment.

FIG. 7A illustrates a first switch operation, in the first period, where the first switch unit 13 and the second switch unit 14 connects the bias generating unit 12 with a first terminal of the hall sensor 11 and a second terminal thereof opposite to the first terminal so that a current is to be flown from the first terminal toward the second terminal, and also connects a third terminal of the hall sensor 11 and a fourth terminal thereof opposite to the third terminal with a positive input terminal and a negative input terminal of the differential amplifier 15, respectively. FIG. 7B illustrates a second switch operation, in the first period, where the first switch unit 13 and the second switch unit 14 connects the bias generating unit 12 with the third terminal and the fourth terminal so that a current is to be flown from the third terminal toward the fourth terminal, and also connects the second terminal and the first terminal with the positive input terminal and the negative input terminal of the differential amplifier 15, respectively. FIG. 7C illustrates a third switch operation, in the first period, where the first switch unit 13 and the second switch unit 14 connects the bias generating unit 12 with the second terminal and the first terminal so that a current is to be flown from the second terminal toward the first terminal, and also connects the fourth terminal and the third terminal with the positive input terminal and the negative input terminal of the differential amplifier 15, respectively. FIG. 7D illustrates a fourth switch operation, in the first period, where the first switch unit 13 and the second switch unit 14 connects the bias generating unit 12 with the fourth terminal and the third terminal so that a current is to be flown from the fourth terminal toward the third terminal, and also connects the first terminal and the second terminal with the positive input terminal and the negative input terminal of the differential amplifier 15, respectively.

Additionally, FIG. 7E illustrates a fifth switch operation, in the second period, where the first switch unit 13 and the second switch unit 14 connects the bias generating unit 12 with the first terminal and the second terminal so that a current is to be flown from the first terminal toward the second terminal, and also connects the fourth terminal and the third terminal with the positive input terminal and the negative input terminal of the differential amplifier 15, respectively. FIG. 7F illustrates a sixth switch operation, in the second period, where the first switch unit 13 and the second switch unit 14 connects the bias generating unit 12 with the third terminal and the fourth terminal so that a current is to be flown from the third terminal toward the fourth terminal, and also connects the first terminal and the second terminal with the positive input terminal and the negative input terminal of the differential amplifier 15, respectively. FIG. 7G illustrates a seventh switch operation, in the second period, where the first switch unit 13 and the second switch unit 14 connects the bias generating unit 12 with the second terminal and the first terminal so that a current is to be flown from the second terminal toward the first terminal, and also connects the third terminal and the fourth terminal with the positive input terminal and the negative input terminal of the differential amplifier 15, respectively. FIG. 7H, in the second period, illustrates an eighth switch operation where the first switch unit 13 and the second switch unit 14 connects the bias generating unit 12 with the fourth terminal and the third terminal so that a current is to be flown from the fourth terminal toward the third terminal, and also connects the second terminal and the first terminal with the positive input terminal and the negative input terminal of the differential amplifier 15, respectively.

In this manner, the control operations of the first switch unit 13 and the second switch unit 14 are changed so that the first terminal to the fourth terminal of the hall sensor 11 are periodically shifted in eight phases of 0°→90°→180°'→270°'→0°'→90°'→180°→270° and connected, as illustrated in FIG. 7A to FIG. 7H.

Expressions (10) to (17) represent the output differential voltage $V_1$ of the second switch unit 14 calculated by adding the hall electromotive force $V_{1H}$ and the offset voltage $V_{1O}$ of the hall sensor 11. The connect status at phases 0°', 90°', 180°', and 270°' are status having the same bias current directions with those of 0°, 90°, 180°, and 270° where the output terminals are inverted, respectively.

$$0°: \ V_1\left(t = n \times \frac{T}{8}\right) = +V_{1H} + V_{1O} \tag{10}$$

$$90°: \ V_1\left(t = n \times \frac{2T}{8}\right) = +V_{1H} - V_{1O} \tag{11}$$

$$180°': \ V_1\left(t = n \times \frac{3T}{8}\right) = -(-V_{1H} - V_{1O}) \tag{12}$$

$$270°': \ V_1\left(t = n \times \frac{4T}{8}\right) = -(-V_{1H} + V_{1O}) \tag{13}$$

$$0°': \ V_1\left(t = n \times \frac{5T}{8}\right) = -(+V_{1H} + V_{1O}) \tag{14}$$

$$90°': \ V_1\left(t = n \times \frac{6T}{8}\right) = -(+V_{1H} - V_{1O}) \tag{15}$$

$$180°: \ V_1\left(t = n \times \frac{7T}{8}\right) = -V_{1H} - V_{1O} \tag{16}$$

$$270°: \ V_1\left(t = n \times \frac{8T}{8}\right) = -V_{1H} + V_{1O} \tag{17}$$

The differential amplifier 15 amplifies the output differential voltage $V_1$ of the second switch unit 14 and an offset voltage $V_{2O}$ specific to the differential amplifier 15, at a fixed magnification A. The reversing unit (third switch unit) 16 is controlled to demodulate the output differential voltage of the differential amplifier 15 and supply the demodulated output differential voltage to the integrator 17. Expressions (18) to (25) represent the output differential voltage $V_2$ of the reversing unit (third switch unit) 16.

$$0°: \ V_2\left(t = n \times \frac{T}{8}\right) = A \times (+V_{1H} + V_{1O} + V_{2O}) \tag{18}$$

$$90°: \ V_2\left(t = n \times \frac{2T}{8}\right) = A \times (+V_{1H} + V_{1O} + V_{2O}) \tag{19}$$

$$180°': \ V_2\left(t = n \times \frac{3T}{8}\right) = A \times (-(-V_{1H} - V_{1O}) + V_{2O}) \tag{20}$$

$$270°': \ V_2\left(t = n \times \frac{4T}{8}\right) = A \times (-(-V_{1H} + V_{1O}) + V_{2O}) \tag{21}$$

$$0°': \ V_2\left(t = n \times \frac{5T}{8}\right) = -A \times (-(+V_{1H} + V_{1O}) + V_{2O}) \tag{22}$$

$$90°': \ V_2\left(t = n \times \frac{6T}{8}\right) = -A \times (-(+V_{1H} - V_{1O}) + V_{2O}) \tag{23}$$

$$180°: \ V_2\left(t = n \times \frac{7T}{8}\right) = -A \times (-V_{1H} - V_{1O} + V_{2O}) \tag{24}$$

$$270°: \ V_2\left(t = n \times \frac{8T}{8}\right) = -A \times (-V_{1H} + V_{1O} + V_{2O}) \tag{25}$$

Figures 8, 9:
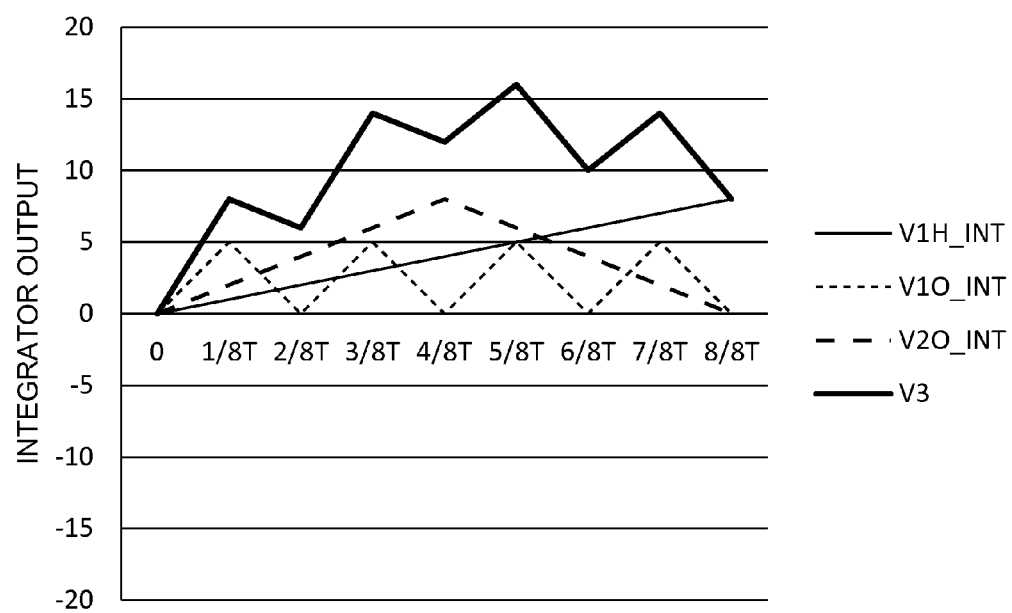
FIG. 8 is a view illustrative of polarities of input/output voltages in respective blocks of the switch units in the magnetism detection device illustrated in FIG. 6, according to the present invention.
FIG. 9 is a view illustrative of output waveforms of an integrator in the magnetism detection device illustrated in FIG. 6, according to the present invention.

FIG. 8 is a view illustrative of polarities of input/output voltages in respective blocks of the switch units in the magnetism detection device illustrated in FIG. 6, according to the present embodiment. FIG. 8 illustrates the polarities of the hall electromotive force $V_{1H}$, the hall offset voltage $V_{1O}$, and the offset voltage $V_{2O}$ of the differential amplifier 15, and also illustrates the polarities of the hall electromotive force $V_{1H}'$, the hall offset voltage $V_{1O}'$, and the offset voltage $V_{2O}'$ of the differential amplifier 15, which are demodulated by the reversing unit 16.

It is understood from FIG. 8 that the chopper modulation frequency of the offset voltage $V_{1O}$ of the hall sensor 11 is two times higher, with the chopper modulation frequency $F_{CHP}$ of the hall electromotive force $V_{1H}$ being maintained.

FIG. 9 is a view illustrative of output waveforms of an integrator in the magnetism detection device illustrated in FIG. 6, according to the present embodiment. While the integrator 17 is repeating the chopper operation "n" times, the output differential voltage of the third switch unit 16 is integrated and amplified.

The output voltage $V_3$ of the integrator 17 is represented by Expression (26), and has a voltage waveform as illustrated in FIG. 9.

$$V_3 = \sum_{t=0}^{t=2n\frac{T}{2}} V_2(t) = \qquad (26)$$

$$n \times \begin{pmatrix} \sum_{t=0}^{t=\frac{T}{8}} V_2(t) + \sum_{t=\frac{T}{8}}^{t=\frac{2T}{8}} V_2(t) + \sum_{t=\frac{2T}{8}}^{t=\frac{3T}{8}} V_2(t) + \sum_{t=\frac{3T}{8}}^{t=\frac{4T}{8}} V_2(t) + \\ \sum_{t=\frac{4T}{8}}^{t=\frac{5T}{8}} V_2(t) + \sum_{t=\frac{5T}{8}}^{t=\frac{6T}{8}} V_2(t) + \sum_{t=\frac{6T}{8}}^{t=\frac{7T}{8}} V_2(t) + \sum_{t=\frac{7T}{8}}^{t=\frac{8T}{8}} V_2(t) \end{pmatrix} =$$

$$n \times 4AV_{1H}$$

That is, the first switch unit 13 and the second switch unit 14 repeats the switch operation "n" times (where n is an integer equal to or greater than 2) in the first period, and repeats the switch operation "n" times in the second period, and the reversing unit 16 reverses the polarity of the voltage from the differential amplifier 15 in synchronization with the switch operation between the first period and the second period.

According to another embodiment of the present invention, the magnetism detection device is provided with: the hall sensor 11 that detects the magnetism; the bias generating unit 12 that drives the hall sensor 11; the first switch unit 13 and the second switch unit 14 that switch the direction of a current flown from the bias generating unit 12 across two opposite terminals of the four terminals of the hall sensor 11, and switch the direction of a voltage to be available in remaining two opposite terminals in the direction orthogonal to the above direction of the current; the differential amplifier 15 that amplifies the voltage made available by the switch operations of the first switch unit 13 and the second switch unit 14; the reversing unit 16 that reverses the polarity of the voltage from the differential amplifier 15; and the integrator 17 that integrates the voltage made available by reversing the polarity by the reversing unit 16, wherein the operation frequency of alternating the polarity of the hall offset voltage of the hall sensor 11 is "2n" times (where n is an integer equal to or greater than 1) the operation frequency of alternating the polarity of the hall electromotive force of the hall sensor 11.

Figure 1:
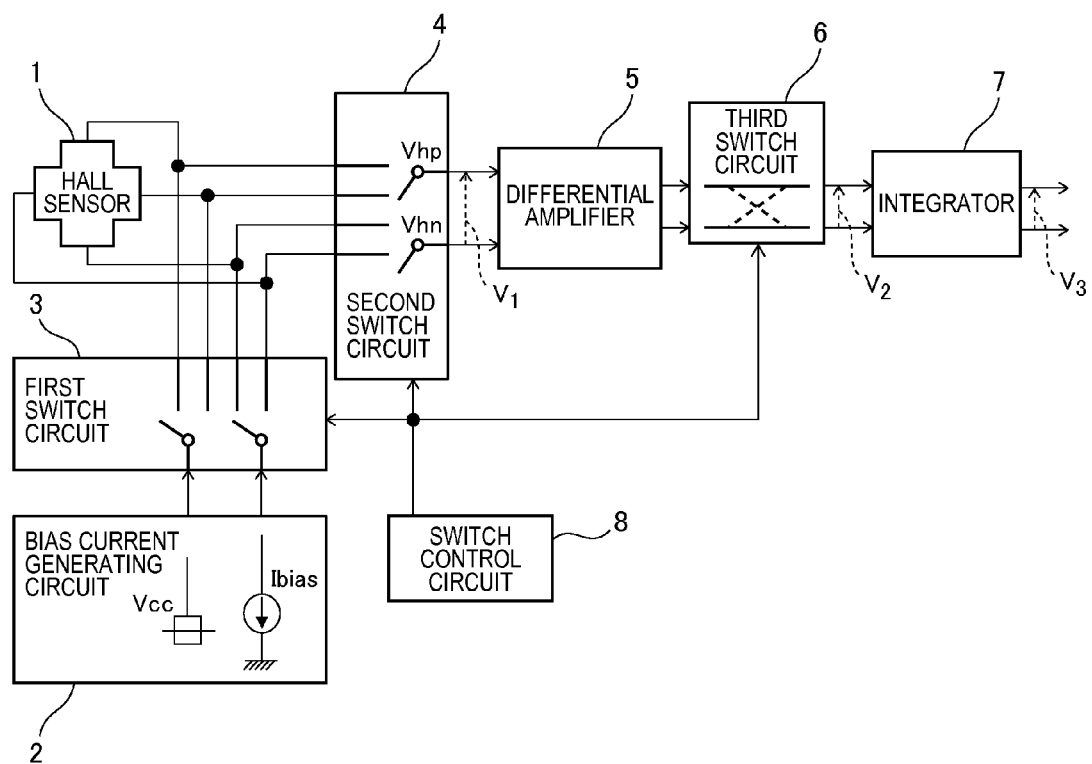
FIG. 1 is a circuit configuration view illustrative of a conventional magnetism detection device.
Figure 2:
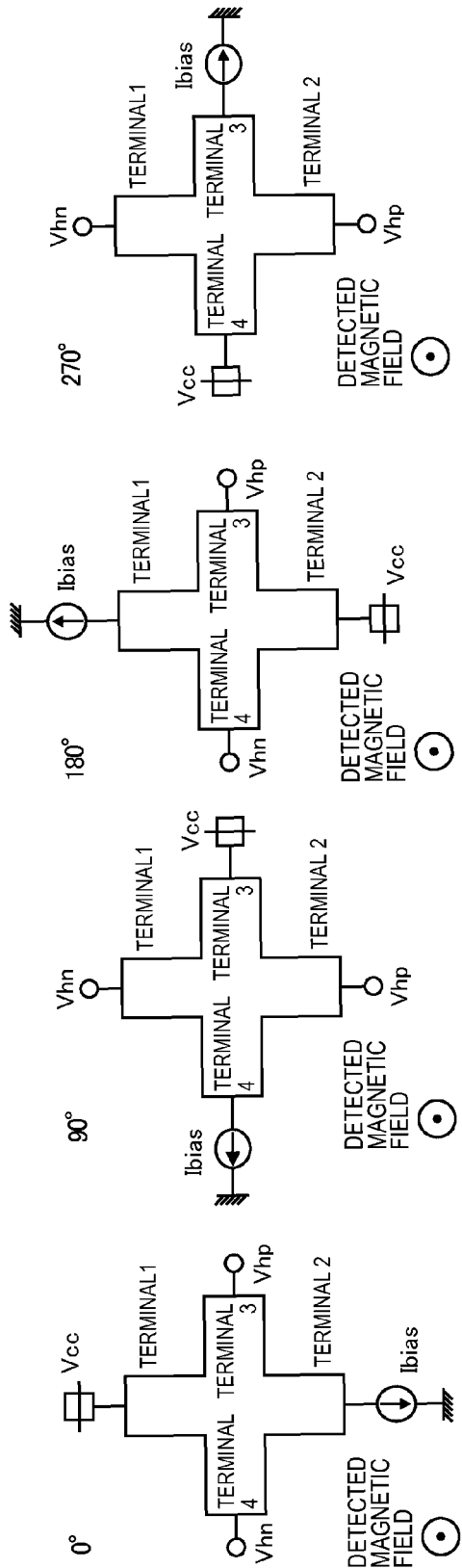
FIG. 2A to FIG. 2D are views illustrative of connection states of a hall sensor in respective chopper phases switched by switch circuits illustrated in FIG. 1.
Figures 3, 4:
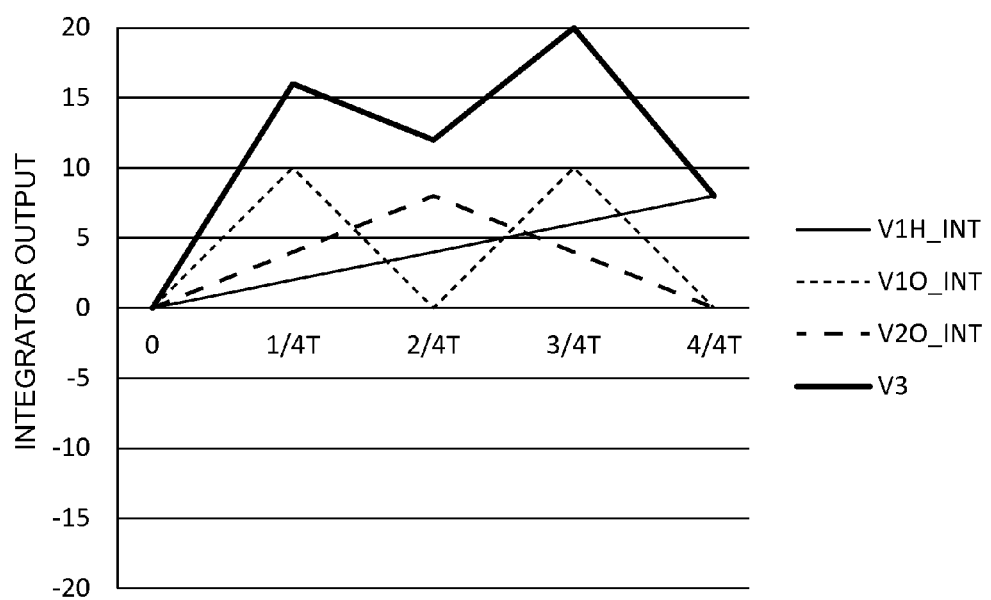
FIG. 3 is a view illustrative of polarities of output voltages in respective chopper phases switched by the switch circuits illustrated in FIG. 1.
FIG. 4 is a view illustrative of output waveforms of an integrator in FIG. 1.
Figure 5:
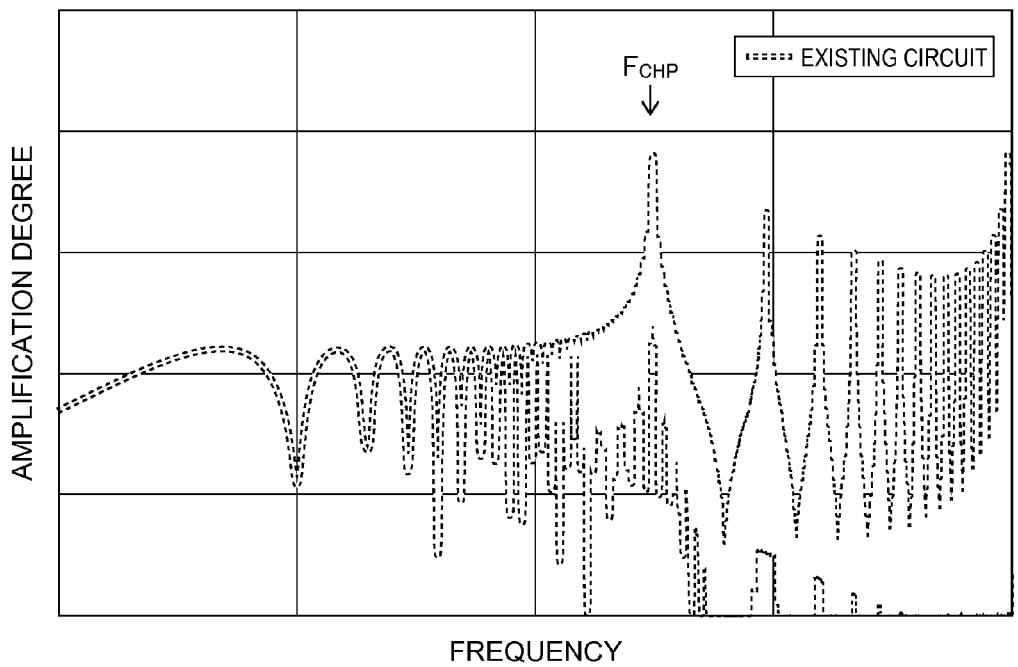
FIG. 5 is a view illustrative of frequency characteristics of a chopper modulation transfer function with respect to a hall sensor noise.

As described above, as the $V_{10\_INT}$ waveform of FIG. 4 and that of FIG. 9 can be compared, the amplification degree of the integrator 17 of the offset voltage $V_{10}$ of the hall sensor 11 at the integrator 17 can be suppressed to half by doubling the chopper modulation frequency $F_{CHP}$ of the offset voltage $V_{10}$ of the hall sensor 11. This enables suppression of the output operation voltage range of the integrator 17, and the amplification degree at the integrator 17 can be made larger by such a suppressed degree. In addition, since the chopper modulation frequency of the hall electromotive force $V_{1H}$ is maintained at $F_{CHPn}$, it is possible to overcome the disadvantage of the settling error of the hall electromotive force $V_{1H}$ at the differential amplifier 15. Accordingly, this produces the effect of not causing an S/N degradation or an increase in the temperature variation degree of the output voltage $V_3$ of the integrator 17.

Figure 10:
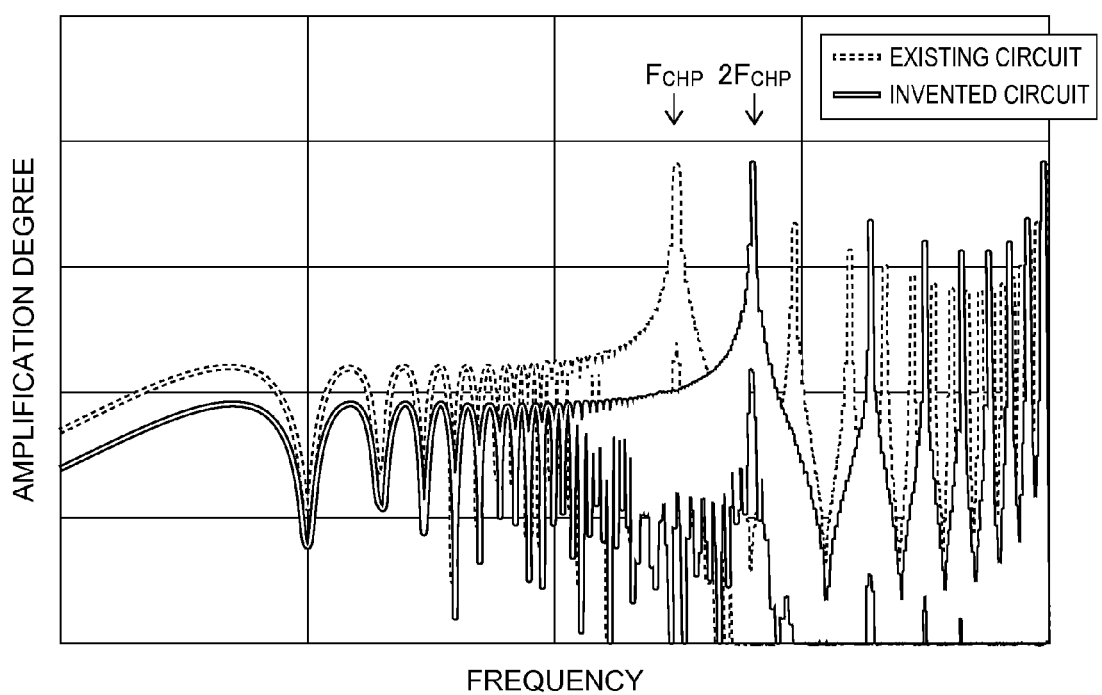
FIG. 10 is a view illustrative of frequency characteristics of chopper modulation transfer functions with respect to the noise of the hall sensor according to the present invention.

FIG. 10 is a view illustrative of frequency characteristics of chopper modulation transfer functions with respect to the noise of the hall sensor, according to the present invention. By increasing the chopper modulation frequency of the hall sensor 11, the frequency characteristics of the chopper modulation transfer functions with respect to the noise of the hall sensor are modulated to a higher band. It is therefore possible to improve the noise suppression effect due to the low-pass filer characteristics at the integrator at the latter stage. Further, when the element noise of the hall sensor 11 is dominant over the whole system noise, the whole system noise can be suppressed small according to the present invention.

Even in other combinations than the above-described one, the same effect is obtainable by combining the phase states of 0°, 90°, 180°, and 270° and those of 0°', 90°', 180°', and 270°' having the same bias current direction and inverted output terminal, in one cycle demodulated at the reversing unit 16. For example, a combination of 0°→270°'→90°'→180°'→0°'→270°→180°→90°' is conceivable.

In addition, it is made possible to increase the chopper modulation frequency of the offset voltage $V_{10}$ specific to the hall sensor up to "2a" times with respect to the chopper modulation frequency $F_{CHP}$ of the hall electromotive force $V_{1H}$, by repeating the operation of 0°'→90°'→180°→270° "a" times after the operation of 0°→90°→180°'→270°' is repeated "a" times. Thus, the above-described effect can be further improved.

In this manner, it is possible to achieve the magnetism detection device capable of suppressing the amplification degree of the integrator of the offset voltage of the hall sensor at the integrator and suppressing the operation voltage range at the integrator considerably, by increasing the chopper modulation frequency of the offset voltage of the hall sensor.

It is to be noted that in the above-described embodiments of the present invention, the integrator 17 integrates the voltage made available by reversing the polarity at the reversing unit 16. The present invention, however, is not limited to this. After the integrator 17 integrates the voltage from the differential amplifier 15, the reversing unit 16 may reverse the polarity of the voltage.

Further, in the above-described embodiments of the present invention, the bias generating unit 12 drives the hall sensor 11 through the current. The present invention, however, is not limited to this. A bias voltage generator may drive the hall sensor 11 through the voltage.

FIG. 11 is a view illustrative of a flowchart of a magnetism detection method according to the present embodiment. In the magnetism detection method according to the present invention, firstly, in the first period, the direction of the current flown across two opposite terminals of four terminals of the hall sensor 11 is switched and the direction of a voltage to be available in remaining two opposite terminals in the direction orthogonal to the above direction of the current is switched, so that the polarity of the hall electromotive force of the hall sensor 11 is the first polarity and the polarity of the hall offset voltage alternates four times (step S1).

Next, in the second period, the direction of the current flown across two opposite terminals of four terminals of the hall sensor 11 is switched and the direction the of the voltage to be available in remaining two opposite terminals in the direction orthogonal to the above direction of the current is switched, so that the polarity of the hall electromotive force of the hall sensor 11 is the second polarity opposite to the first polarity and the polarity of the hall offset voltage alternates four times (step S2).

Then, the voltage made available by the switch operation is amplified (step S3). After that, the polarity of the amplified voltage is reversed in synchronization with the switch operation between the first period and the second period, from among the switch operations of switching the current and voltage (step S4). Subsequently, the voltage made available by reversing is integrated (step S5).

In this manner, it is made possible to achieve the magnetism detection device capable of suppressing the amplification degree of the integrator of the offset voltage of the hall sensor at the integrator and suppressing the operation voltage range at the integrator considerably, by increasing the chopper modulation frequency of the offset voltage of the hall sensor.

In the above-described magnetism detection device of Patent Document 1, the settling time of the differential amplifier is finite, and each chopper phase is shifted in the order of 0°→90°→180°→270° in the case where the settling time at the rising of the input voltage and the settling time at the falling thereof are different. Thus, the offset voltage of the hall sensor and the offset voltage of the differential amplifier are removed with high accuracy. However, in the above-described magnetism detection device of Patent Document 1, the phase states of 0°, 90°, 180°, and 270° in one chopper cycle and the phase states of 0°', 90°', 180°', and 270°' having the same bias current directions and inverted output terminals are not combined periodically as in the present invention. The effect of considerably suppressing the operating voltage range at the integrator is not obtainable without incurring a signal loss of the hall electromotive force even the chopper modulation frequency of the offset voltage is increased.

Additionally, in the above-described magnetism detection device of Patent Document 2, the order of shifting the two states such as the chopper phases (0°, 270°) is changed at random and the disturbance noise received by the amplifier or the like is subjected to the spread spectrum so as to enable the high-speed responsiveness while removing the noise effectively. However, in the above-described magnetism detection device of Patent Document 2, the phase states of 0°, 90°, 180°, and 270° in one chopper cycle and the phase states of 0°', 90°', 180°', and 270°' having the same bias current directions and inverted output terminals are not combined periodically as in the present invention. The effect of considerably suppressing the operating voltage range at the integrator is not obtainable without incurring a signal loss of the hall electromotive force even the chopper modulation frequency of the offset voltage is increased.

Further, in the above-described magnetism detection device of Patent Document 3, the integration type A/D converter having a circuit of adding or subtracting the reference voltage Vref is used in synchronization with the outputs from the hall sensor chopper modulated by shifting in the order of 0°→90°→180°→270°. Hence, the offset voltages of the hall sensor and the analog element can be removed with high accuracy and the hall electromotive force can be detected with high accuracy. However, in the above-described magnetism detection device of Patent Document 3, the phase states of 0°, 90°, 180°, and 270° in one chopper cycle and the phase states of 0°', 90°', 180°', and 270°' having the same bias current directions and inverted output terminals are not combined periodically as in the present invention. The effect of considerably suppressing the operating voltage range at the integrator without incurring a signal loss of the hall electromotive force even the chopper modulation frequency of the offset voltage is increased is not obtainable.

REFERENCE SIGNS LIST 1, 11 hall sensor
2 bias current generating circuit
3 first switch circuit
4 second switch circuit
5 differential amplifier
6 third switch circuit
7 integrator
8 switch control circuit
12 bias generating unit
13 first switch unit
14 second switch unit
15 differential amplifier
16 reversing unit (third switch unit)
17 integrator
18 switch control unit

The invention claimed is:

1. A magnetism detection device comprising:
a hall sensor that detects magnetism;
a bias generating unit that drives the hall sensor;
a switch unit that is connected to the hall sensor, that carries out a switch operation of switching a direction of current flown from the bias generating unit across two opposite terminals of four terminals of the hall sensor, and switching the direction of a voltage to be available in remaining two opposite terminals in a direction orthogonal to the direction of the current, so that in a first period, a polarity of a hall electromotive force of the hall sensor is a first polarity and a polarity of the hall offset voltage of the hall sensor alternates four times, and in a second period, the polarity of the hall electromotive force of the hall sensor is a second polarity opposite to the first polarity and the polarity of the hall offset voltage of the hall sensor alternates four times;
an amplifier that amplifies the voltage made available by the switch operation of the switch unit; and
a reversing unit that reverses the polarity of the voltage from the amplifier in synchronization with the switching operation between the first period and the second period out of switching operations of the current and the voltage switched by the switch unit,
wherein the switch unit carries out, in the first period:
a first switch operation of connecting the bias generating unit with a first terminal of the hall sensor and a second terminal of the hall sensor opposite to the first terminal so that the current is to be flown from the first terminal toward the second terminal, and also connecting a third terminal of the hall sensor and a fourth terminal of the hall sensor opposite to the third terminal with a positive input terminal and a negative input terminal of the amplifier, respectively;
a second switch operation of connecting the bias generating unit with the third terminal and the fourth terminal so that the current is to be flown from the third terminal toward the fourth terminal, and also connecting the second terminal and the first terminal with the positive input terminal and the negative input terminal of the amplifier, respectively;
a third switch operation of connecting the bias generating unit with the second terminal and the first terminal so that the current is to be flown from the second terminal toward the first terminal, and also connecting the fourth terminal and the third terminal with the positive input terminal and the negative input terminal of the amplifier, respectively; and
a fourth switch operation of connecting the bias generating unit with the fourth terminal and the third terminal so that the current is to be flown from the fourth terminal toward the third terminal, and also connecting the first terminal and the second terminal with the positive input terminal and the negative input terminal of the amplifier, respectively, and wherein the switch unit carries out, in the second period:
a fifth switch operation of connecting the bias generating unit with the first terminal and the second terminal so that the current is to be flown from the first terminal toward the second terminal, and also connecting the fourth terminal and the third terminal with the positive input terminal and the negative input terminal of the amplifier, respectively;
a sixth switch operation of connecting the bias generating unit with the third terminal and the fourth terminal so that the current is to be flown from the third terminal toward the fourth terminal, and also connecting the first terminal and the second terminal with the positive input terminal and the negative input terminal of the amplifier, respectively;
a seventh switch operation of connecting the bias generating unit with the second terminal and the first terminal so that the current is to be flown from the second terminal toward the first terminal, and also connecting the third terminal and the fourth terminal with the positive input terminal and the negative input terminal of the amplifier, respectively; and
an eighth switch operation of connecting the bias generating unit with the fourth terminal and the third terminal so that the current is to be flown from the fourth terminal toward the third terminal, and also connecting the second terminal and the first terminal with the positive input terminal and the negative input terminal of the amplifier, respectively.

2. The magnetism detection device according to claim 1, wherein the switch unit repeats the switch operation in the first period n times, where n is an integer equal to or greater than 2, and repeats the switch operation in the second period n times, and
wherein the reversing unit reverses the polarity of the voltage from the amplifier in synchronization with the switching operation between the first period and the second period.

3. A magnetism detection device comprising:
a hall sensor that detects magnetism, the hall sensor having a first terminal, a second terminal opposite to the first terminal, a third terminal, and a fourth terminal opposite to the third terminal;
a bias generating unit that drives the hall sensor;
a switch unit that carries out a switch operation of switching a direction of a current flown from the bias generating unit across two opposite terminals of four terminals of the hall sensor, and switching a direction of a voltage to be available in remaining two opposite terminals in a direction orthogonal to the direction of the current, respectively;
an amplifier that amplifies the voltage made available by the switch operation of the switch unit;
a reversing unit that reverses a polarity of the voltage from the amplifier;
a switch controller that controls the switch operation of the switch unit, such that in a first period, a polarity of a hall electromotive force of the hall sensor is a first polarity and a polarity of a hall offset voltage of the hall sensor alternates four times, and in a second period, the polarity of the hall electromotive force of the hall sensor is a second polarity opposite to the first polarity and the polarity of the hall offset voltage of the hall sensor alternates four times,
wherein an operation frequency when the polarity of the hall offset voltage of the hall sensor alternates is 2n times the operation frequency when the polarity of the hall electromotive force of the hall sensor alternates, where n is an integer equal to or greater than 1,
the switch operation including, in the first period:
a first switch operation of connecting the bias generating unit with the first terminal and the second terminal, and also connecting the third terminal and the fourth terminal with a positive input terminal and a negative input terminal of the amplifier, respectively;
a second switch operation of connecting the bias generating unit with the third terminal and the fourth terminal, and also connecting the second terminal and the first terminal with the positive input terminal and the negative input terminal of the amplifier, respectively;
a third switch operation of connecting the bias generating unit with the second terminal and the first terminal, and also connecting the fourth terminal and the third terminal with the positive input terminal and the negative input terminal of the amplifier, respectively; and
a fourth switch operation of connecting the bias generating unit with the fourth terminal and the third terminal, and also connecting the first terminal and the second terminal with the positive input terminal and the negative input terminal of the amplifier, respectively, and
the switch operation including, in the second period:
a fifth switch operation of connecting the bias generating unit with the first terminal and the second terminal, and also connecting the fourth terminal and the third terminal with the positive input terminal and the negative input terminal of the amplifier, respectively;
a sixth switch operation of connecting the bias generating unit with the third terminal and the fourth terminal, and also connecting the first terminal and the second terminal with the positive input terminal and the negative input terminal of the amplifier, respectively;
a seventh switch operation of connecting the bias generating unit with the second terminal and the first terminal, and also connecting the third terminal and the fourth terminal with the positive input terminal and the negative input terminal of the amplifier, respectively; and
an eighth switch operation of connecting the bias generating unit with the fourth terminal and the third terminal, and also connecting the second terminal and the first terminal with the positive input terminal and the negative input terminal of the amplifier, respectively.

4. A magnetism detection method in a magnetism detection device comprising a hall sensor that detects magnetism, the hall sensor having a first terminal, a second terminal opposite to the first terminal, a third terminal, and a fourth terminal opposite to the third terminal, and a bias generating unit that drives the hall sensor, the magnetism detection method comprising:
carrying out, by a switch unit connected to the hall sensor, a switch operation of switching a direction of a current flown across two opposite terminals of four terminals of the hall sensor, and switching a direction of a voltage to be available in remaining two opposite terminals in a direction orthogonal to the direction of the current, respectively, so that in a first period, a polarity of a hall electromotive force of the hall sensor is a first polarity and a polarity of a hall offset voltage of the hall sensor alternates four times;

carrying out, by the switch unit connected to the hall sensor, a switch operation of switching the direction of the current flown across the two opposite terminals of the four terminals of the hall sensor, and switching the direction of the voltage to be available in the remaining two opposite terminals in the direction orthogonal to the direction of the current, so that in a second period, the polarity of the hall electromotive force of the hall sensor is a second polarity opposite to the first polarity and the polarity of the hall offset voltage alternates four times;

amplifying, by an amplifier, the voltage made available by the switch operation of the switch unit; and reversing, by a reversing unit, a polarity of the amplified voltage in synchronization with the switch operation between the first period and the second period out of the switch operations of switching the current and the voltage by the switch unit, the switch operation including, in the first period:
  connecting the bias generating unit with the first terminal and the second terminal, and also connecting the third terminal and the fourth terminal with a positive input terminal and a negative input terminal of the amplifier, respectively;
  connecting the bias generating unit with the third terminal and the fourth terminal, and also connecting the second terminal and the first terminal with the positive input terminal and the negative input terminal of the amplifier, respectively;
  connecting the bias generating unit with the second terminal and the first terminal, and also connecting the fourth terminal and the third terminal with the positive input terminal and the negative input terminal of the amplifier, respectively; and
  connecting the bias generating unit with the fourth terminal and the third terminal, and also connecting the first terminal and the second terminal with the positive input terminal and the negative input terminal of the amplifier, respectively, and the switch operation including, in the second period:
  connecting the bias generating unit with the first terminal and the second terminal, and also connecting the fourth terminal and the third terminal with the positive input terminal and the negative input terminal of the amplifier, respectively;
  connecting the bias generating unit with the third terminal and the fourth terminal, and also connecting the first terminal and the second terminal with the positive input terminal and the negative input terminal of the amplifier, respectively;
  connecting the bias generating unit with the second terminal and the first terminal, and also connecting the third terminal and the fourth terminal with the positive input terminal and the negative input terminal of the amplifier, respectively; and
  connecting the bias generating unit with the fourth terminal and the third terminal, and also connecting the second terminal and the first terminal with the positive input terminal and the negative input terminal of the amplifier, respectively.

5. The magnetism detection device according to claim 1, wherein the switch unit repeats the switch operation in the first period n times, where n is an integer equal to or greater than 2, and repeats the switch operation in the second period n times, and wherein the reversing unit reverses the polarity of the voltage from the amplifier in synchronization with the switching operation between the first period and the second period.

6. A magnetism detection device, comprising:
a hall sensor having a first terminal, a second terminal opposite to the first terminal, a third terminal, and a fourth terminal opposite to the third terminal;
a bias generating unit that drives the hall sensor;
a switch unit that is connected to the hall sensor and that carries out a switch operation;
an amplifier that amplifies the voltage made available by the switch operation of the switch unit;
a switch controller that controls the switch operation of the switch unit; and
a reversing unit that reverses a polarity of a voltage from the amplifier, the switch operation including, in a first period:
  a first switch operation of connecting the bias generating unit with the first terminal and the second terminal, and also connecting the third terminal and the fourth terminal with a positive input terminal and a negative input terminal of the amplifier, respectively;
  a second switch operation of connecting the bias generating unit with the third terminal and the fourth terminal, and also connecting the second terminal and the first terminal with the positive input terminal and the negative input terminal of the amplifier, respectively;
  a third switch operation of connecting the bias generating unit with the second terminal and the first terminal, and also connecting the fourth terminal and the third terminal with the positive input terminal and the negative input terminal of the amplifier, respectively; and
  a fourth switch operation of connecting the bias generating unit with the fourth terminal and the third terminal, and also connecting the first terminal and the second terminal with the positive input terminal and the negative input terminal of the amplifier, respectively, and the switch operation including, in a second period:
  a fifth switch operation of connecting the bias generating unit with the first terminal and the second terminal, and also connecting the fourth terminal and the third terminal with the positive input terminal and the negative input terminal of the amplifier, respectively;
  a sixth switch operation of connecting the bias generating unit with the third terminal and the fourth terminal, and also connecting the first terminal and the second terminal with the positive input terminal and the negative input terminal of the amplifier, respectively;
  a seventh switch operation of connecting the bias generating unit with the second terminal and the first terminal, and also connecting the third terminal and the fourth terminal with the positive input terminal and the negative input terminal of the amplifier, respectively; and
  an eighth switch operation of connecting the bias generating unit with the fourth terminal and the third terminal, and also connecting the second terminal and the first terminal with the positive input terminal and the negative input terminal of the amplifier, respectively.

7. A magnetism detection device comprising:
a hall sensor that detects magnetism;
a bias generating unit that drives the hall sensor;
a switch unit that is connected to the hall sensor, that carries out a switch operation of switching a direction of current flown from the bias generating unit across two opposite terminals of four terminals of the hall sensor, and switching the direction of a voltage to be available in remaining two opposite terminals in a direction orthogonal to the direction of the current, so that in a first period, a polarity of a hall electromotive force of the hall sensor is a first polarity and a polarity of the hall offset voltage of the hall sensor alternates four times, and in a second period, the polarity of the hall electromotive force of the hall sensor is a second polarity opposite to the first polarity and the polarity of the hall offset voltage of the hall sensor alternates four times;
an amplifier that amplifies the voltage made available by the switch operation of the switch unit; and
a reversing unit that reverses the polarity of the voltage from the amplifier in synchronization with the switching operation between the first period and the second period out of switching operations of the current and the voltage switched by the switch unit,
wherein the switch unit, in the first period:
connects the bias generating unit with a first terminal of the hall sensor and a second terminal of the hall sensor opposite to the first terminal so that the current is to be flown from the first terminal toward the second terminal, connects a third terminal of the hall sensor and a fourth terminal of the hall sensor opposite to the third terminal with a positive input terminal and a negative input terminal of the amplifier, respectively;
connects the bias generating unit with the third terminal and the fourth terminal so that the current is to be flown from the third terminal toward the fourth terminal, and connects the second terminal and the first terminal with the positive input terminal and the negative input terminal of the amplifier, respectively;
wherein the switch unit, in the second period:
connects the bias generating unit with the second terminal and the first terminal so that the current is to be flown from the second terminal toward the first terminal, and connects the third terminal and the fourth terminal with the positive input terminal and the negative input terminal of the amplifier, respectively; and
connects he bias generating unit with the fourth terminal and the third terminal so that the current is to be flown from the fourth terminal toward the third terminal, and connects the second terminal and the first terminal with the positive input terminal and the negative input terminal of the amplifier, respectively.

8. A magnetism detection device comprising:
a hall sensor that detects magnetism, the hall sensor having a first terminal, a second terminal opposite to the first terminal, a third terminal, and a fourth terminal opposite to the third terminal;
a bias generating unit that drives the hall sensor;
a switch unit that carries out a switch operation of switching a direction of a current flown from the bias generating unit across two opposite terminals of four terminals of the hall sensor, and switching a direction of a voltage to be available in remaining two opposite terminals in a direction orthogonal to the direction of the current, respectively;
an amplifier that amplifies the voltage made available by the switch operation of the switch unit;
a reversing unit that reverses a polarity of the voltage from the amplifier;
a switch controller that controls the switch operation of the switch unit, such that in a first period, a polarity of a hall electromotive force of the hall sensor is a first polarity and a polarity of a hall offset voltage of the hall sensor alternates four times, and in a second period, the polarity of the hall electromotive force of the hall sensor is a second polarity opposite to the first polarity and the polarity of the hall offset voltage of the hall sensor alternates four times,
wherein an operation frequency when the polarity of the hall offset voltage of the hall sensor alternates is 2n times the operation frequency when the polarity of the hall electromotive force of the hall sensor alternates, where n is an integer equal to or greater than 1,
the switch operation including, in the first period:
connecting the bias generating unit with the third terminal and the fourth terminal, and also connecting the second terminal and the first terminal with the positive input terminal and the negative input terminal of the amplifier, respectively;
the switch operation including, in the second period:
connecting the bias generating unit with the second terminal and the first terminal, and also connecting the third terminal and the fourth terminal with the positive input terminal and the negative input terminal of the amplifier, respectively; and
connecting the bias generating unit with the fourth terminal and the third terminal, and that also connecting the second terminal and the first terminal with the positive input terminal and the negative input terminal of the amplifier, respectively.

* * * * *